(12) United States Patent  
Cartmill et al.

(10) Patent No.: US 11,402,127 B2  
(45) Date of Patent: Aug. 2, 2022

(54) ELECTRIC HOT WATER HEATER ENERGY MANAGEMENT

(71) Applicant: Think Tank Water Heaters Ltd., Fredericton (CA)

(72) Inventors: Charles Andrew Cartmill, Halifax (CA); Simon Lightbody, Fredericton (CA); Damon Langlois, Fredericton (CA); Kent Mader, Fredericton (CA)

(73) Assignee: Think Tank Water Heaters Ltd., Fredericton (CA)

( * ) Notice: Subject to any disclaimer, the term of this patent is extended or adjusted under 35 U.S.C. 154(b) by 555 days.

(21) Appl. No.: 16/062,123

(22) PCT Filed: Dec. 14, 2016

(86) PCT No.: PCT/CA2016/051474  
§ 371 (c)(1),  
(2) Date: Jun. 14, 2018

(87) PCT Pub. No.: WO2017/100919  
PCT Pub. Date: Jun. 22, 2017

(65) Prior Publication Data  
US 2018/0372376 A1  Dec. 27, 2018

Related U.S. Application Data

(60) Provisional application No. 62/267,078, filed on Dec. 14, 2015.

(51) Int. Cl.  
*F24H 9/20* (2022.01)  
*H05B 1/02* (2006.01)  
(Continued)

(52) U.S. Cl.  
CPC .......... *F24H 9/2021* (2013.01); *F24H 1/201* (2013.01); *F24H 1/202* (2013.01); *G01R 21/133* (2013.01);  
(Continued)

(58) Field of Classification Search  
CPC ........ F24H 9/2021; F24H 1/202; F24H 1/201; H05B 1/0269; H05B 1/0297; G01R 21/133  
(Continued)

(56) References Cited

U.S. PATENT DOCUMENTS 4,737,615 A * 4/1988 Stipe ................... F24H 9/2021  
                                                      219/486  
5,568,348 A * 10/1996 Foreman ............. H02J 7/00036  
                                                      361/118

(Continued)

FOREIGN PATENT DOCUMENTS

EP       1811244 A1    7/2007  
WO     9524594 A1    9/1995

OTHER PUBLICATIONS

International Search Report dated Mar. 6, 2017 in PCT/CA2016/051474 (7 pages).  
Written Opinion dated Mar. 6, 2017 in PCT/CA2016/051474 (6 pages).

*Primary Examiner* — Steven B McAllister  
*Assistant Examiner* — John E Bargero  
(74) *Attorney, Agent, or Firm* — FisherBroyles, LLP; Susan M. Oiler

(57) ABSTRACT

A control module for an electrical appliance is provided. The control module comprises a wireless interface, a processor coupled to the wireless interface and a plurality of pins extending from the bottom of the module coupled to the processor, the pins for twist lock interfacing with a recep- (Continued)

tacle of an appliance, wherein the processor can send and receive command related to the control of the appliance.

21 Claims, 9 Drawing Sheets

(51) Int. Cl.
    *F24H 1/20*           (2022.01)
    *G01R 21/133*       (2006.01)

(52) U.S. Cl.
    CPC ......... *H05B 1/0269* (2013.01); *H05B 1/0297* (2013.01)

(58) Field of Classification Search
    USPC ........................................................ 237/8 A
    See application file for complete search history.

(56) References Cited

U.S. PATENT DOCUMENTS

| | | | |
|---|---|---|---|
| 6,737,855 B2 | 5/2004 | Huber et al. | |
| 7,417,558 B2 | 8/2008 | Lightbody et al. | |
| 8,648,264 B2 * | 2/2014 | Masumoto | H02G 3/081 |
| | | | 174/520 |
| 2011/0276289 A1 * | 11/2011 | Park | H04L 12/2827 |
| | | | 702/62 |
| 2012/0181281 A1 * | 7/2012 | Ott | B65D 5/748 |
| | | | 220/277 |
| 2013/0193221 A1 | 8/2013 | Buescher et al. | |
| 2013/0200168 A1 * | 8/2013 | Buescher | G05D 23/1923 |
| | | | 29/428 |
| 2014/0277816 A1 * | 9/2014 | Branecky | F24H 9/2021 |
| | | | 700/300 |
| 2015/0124100 A1 * | 5/2015 | McRory | H04N 5/2257 |
| | | | 348/151 |
| 2018/0080683 A1 * | 3/2018 | Branecky | F24H 1/201 |

* cited by examiner

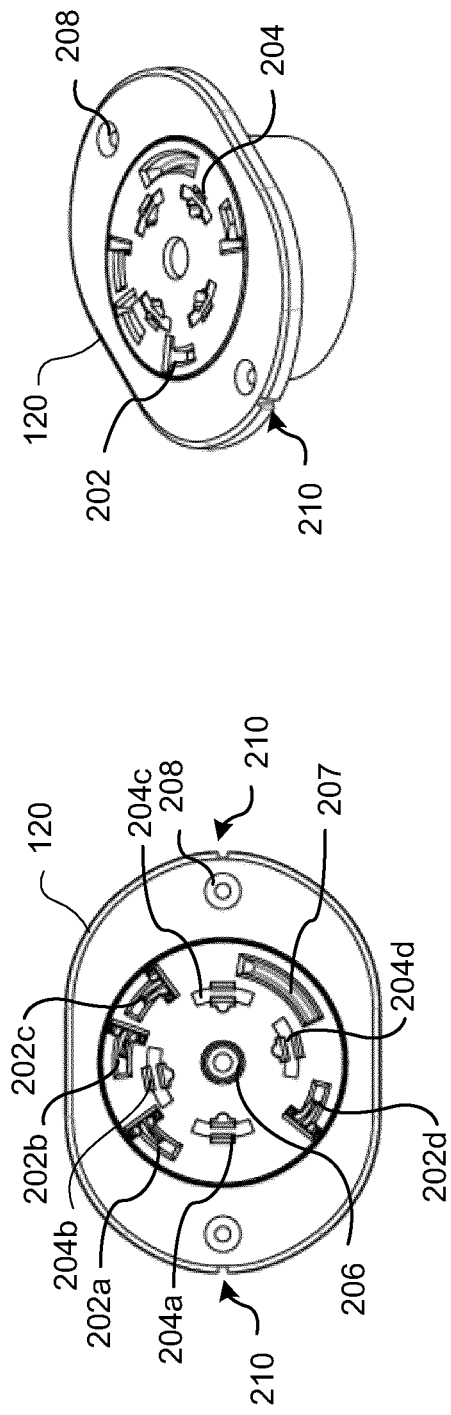
FIG. 2A
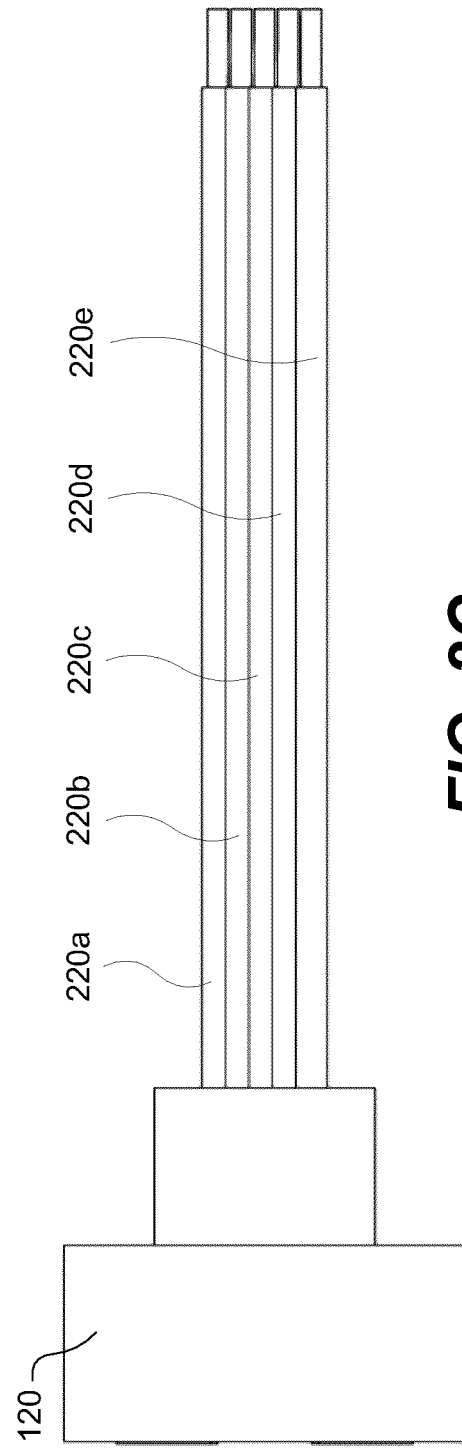
FIG. 2B
FIG. 2C

SECTION A-A
SCALE 1 : 1.5

ELECTRIC HOT WATER HEATER ENERGY MANAGEMENT

CROSS-REFERENCE TO RELATED APPLICATIONS

This application is filed under 35 U.S.C. § 371 as the U.S. national phase of International Patent Application No. PCT/CA2016/051474, filed Dec. 14, 2016, which designated the United States and which claims priority from U.S. Provisional Patent Application No. 62/267,078 filed Dec. 14, 2015, each of which is incorporated in its entirety including all tables, figures, and claims.

TECHNICAL FIELD

The present disclosure relates to electric hot water heater energy management, and in particular to managing electricity usage of electric hot water heaters.

BACKGROUND

As the strain on electrical utility networks grows the need for energy demand management has increased. Electric hot water heaters utilize large amounts of electricity and can have a considerable impact on the electricity grid. In scenarios where electrical utility providers are having difficulty to meet demand, a demand response event may be issued to reduce the electricity usage of users in the network. For electric hot water heaters this has typically been achieved using load control switches that disconnect the associated hot water heater. In another scenario, electrical utility providers may produce electricity that exceeds current demand and require the ability to move excess load from the network. As the need for electricity grows smart power grids enable management of networks loads at an individual homeowner level. The ability to provide control at an appliance level can improve network efficiency and potentially reduce infrastructure capital costs for power generation.

A smart power grid not only provides advantages to the utility providers (as described above) through consumption management programs, there are also several incentives that exist for homeowners such as financial compensation, a reduced lease, lower insurance, guaranteed normal hot water security, etc. However, implementation of consumption management programs have numerous challenges that are inhibiting their widespread use. These challenges include the ability of utility providers to be able to acquire dynamic and real-time information, as well as measurement and verification of the electricity usage. Another challenge is that users/homeowners want to have empowerment so that they can retain some level of control over their electric hot water heater.

Accordingly, additional, alternative, and/or improved equipment, methods, and systems for electric hot water heaters that can control electricity usage while also overcoming some of the challenges described above remains highly desirable.

BRIEF DESCRIPTION OF THE DRAWINGS

Further features and advantages of the present disclosure will become apparent from the following detailed description, taken in combination with the appended drawings, in which:

FIG. 2A-E shows different views of a receptacle as described herein;

It will be noted that throughout the appended drawings, like features are identified by like reference numerals.

DETAILED DESCRIPTION

Figure 1:
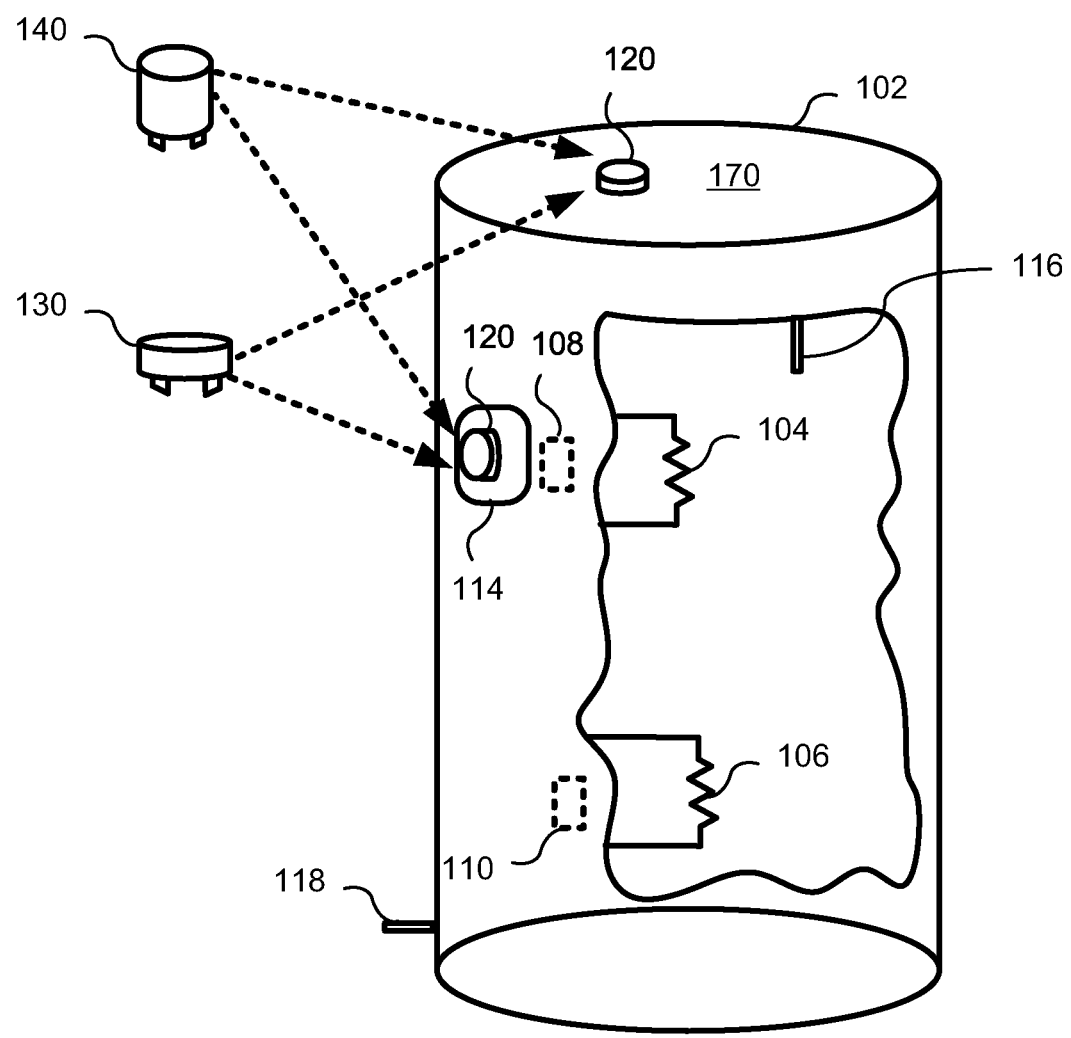
FIG. 1 shows an overview of an electric hot water heater as described herein.

In accordance with an aspect of the present disclosure there is provided a control module for an electric hot water heater, comprising: a processor for controlling an operation of a heating element located in a lower portion of an electric hot water heater tank; a communication interface coupled to the processor to communicate with a utility network head-end; a relay controlled by the processor for coupling and decoupling power to the heating element in the lower portion of the electric hot water heater in response to instructions received through the communication interface from the utility network; and a plurality of pins coupled to the relay and extending from a lower surface of the control module, the pins for insertion into a receptacle provided on a surface of the electric hot water heater tank to interface with power lines to the heating element within the electric hot water heater.

In accordance with another aspect of the present disclosure there is provided a receptacle for an electric hot water, comprising: an upper surface having at least four openings for receiving at least four corresponding pins extending from a bottom surface of a control module or shorting cap; and a plurality of wire leads coupled in-line with a power source and a heating element located in a lower portion of an electric hot water heater tank, the wire leads coupled to the power source are coupled to two of the at least four pins when the control module or shorting cap is inserted into the upper surface of the receptacle, the wire leads coupled to the heating element are coupled to the remaining two of the at least four pins when the control module is inserted into the upper surface of the receptacle.

In accordance with yet another aspect of the present disclosure there is provided an electric hot water heater, comprising: a tank for storing a volume of water; a first heating element inside of the tank for heating the water in the tank coupled with a power source; a receptacle located on an outer surface of the electric hot water heater, the receptacle for receiving one of a shorting cap or a control module, the receptacle couples in-line the first heating element and the power source with the shorting cap or the control module having two or more pins that are received in corresponding openings of the receptacle to complete the power circuit to the first heating element; and a thermostat connected in series with the first heating element, the receptacle, and the power source, the thermostat for measuring a temperature of the water in the tank and actuating a thermostat relay to connect or disconnect the first heating element from the power source.

In accordance with still yet another aspect of the present disclosure there is provided a method of remotely controlling electrical demand of an electric hot water heater, the method comprising: receiving at the control module, inserted in a receptacle of an electric hot water heater, a notification of a control event through a communication interface of the control module; determining, by a processor of the control module an action from the received event; actuating a relay in the control module operably coupled with the processor to control electricity to a heating element located in a lower portion of an electric hot water heater tank at a start time of the control event; and actuating the relay, by the processor, at the completion of the control event.

The invention will now be described in detail with reference to various embodiments thereof as illustrated in the accompanying drawings. Specific details are set forth in order to provide a thorough understanding of the invention. It will be apparent to one skilled in the art that the invention may be practiced without using some of the implementation details set forth herein. It should also be understood that well known operations have not been described in detail in order to not unnecessarily obscure the invention. Equipment, methods, and systems for managing electricity usage of electric hot water heaters is described herein. An electric hot water heater can be supplied or retrofitted with a receptacle that can receive a control module, and when inserted, the control module can remotely receive energy management instructions such as demand response events. The receptacle provides the ability to upgrade features and control functionality of the electric hot water heater by enabling control modules to be easily installed. The control module can measure and control electricity usage in the electric hot water heater by a utility. Moreover, the control module can selectively control certain heating elements from being connected or disconnected in response to network driven events.

Throughout the description embodiments are described with reference to an electric hot water heater having two heating elements: an upper element and a lower element. This implementation is exemplary and is not meant to be limiting or restrictive in any way. A person of ordinary skill in the art will readily envision how to extend the teachings herein to electric hot water heaters having one, two, three, or any other number of heating elements and in any configuration of the elements. Furthermore, embodiments are generally described with reference to the control module controlling the electricity provided to the lower heating element. Again, this is strictly an example of a possible implementation. A person of ordinary skill in the art will readily envision how to extend the teachings herein to control specific heating elements or all heating elements, and for electric hot water heaters having one, two, three, or any other number of heating elements and in any configuration of the elements.

Embodiments are described below, by way of example only, with reference to FIGS. 1-8.

FIG. 1 shows an overview of an electric hot water heater 102. In this example, the electric hot water heater 102 comprises an upper heating element 104 and a lower heating element 106, each respectively coupled to an upper thermostat 108 and a lower thermostat 110. A receptacle 120 is provided either on a surface 170 of the hot water tank or provided as part of a cover plate 114. One or more cover plates 114 may be provided on the exterior of the electric hot water heater tank to provide access to the electric hot water heater wiring. The electric hot water heater 102 may be supplied or retrofitted with a receptacle 120 to receive a control module 140. The receptacle 120 may be mounted on a cover plate 114, or at any other position on the tank provided that the wiring configuration is the same or a variant of the wiring diagram as will be discussed with reference to FIG. 5.

The receptacle 120 is configured to receive one of a shorting cap 130 (shorting cover or shorting module), or a control module 140. The shorting cap 130 or control module 140 may be required to close the circuit so that electricity will be provided to the lower heating element 106, as will be described further herein. The shorting cap 130 or control module 140 may also be required to be inserted to enable operation of the upper heating element 104. The shorting cap 130 may provide no functionality to the electric hot water heater except this ability to allow for electricity to be delivered to the lower heating element. Alternatively, the addition of a control module 140 enables the electric hot water heater 102 to receive energy management instructions (such as demand response events from a utility provider, or heating instructions from the utility or a household's thermostat) to control the operation of one or more heating elements such as for example a lower heating element 106. In the scenario of only controlling the electricity to the lower heating element, the upper heating element can still be used to heat water in the upper portion of the tank, thereby allowing for smaller volumes of water to remain heated while reducing electricity usage. In one example the electric hot water heater 102 may be sold with the receptacle 120 and the shorting cap 140, and when a user wants to participate in a demand response program they may buy the control module 140 separately. As previously mentioned, a user may also retrofit the receptacle 120 onto an existing electric hot water heater.

The electric hot water heater 102 may also comprise various sensors 116, 118, which may for example be leak detection sensors for determining if water is leaking from the tank, or flow rate sensors for determining an amount of water drawn from the tank. Wire leads from these 116, 118 may be operably coupled with the receptacle 120 and the sensor information provided to the control module 140. The control module 140 may also have the ability to communicate with a homeowner's device(s) and to the electrical utility provider, etc.

Any and all units and controls relating to the hot water heater 102, including, but not limited to, the receptacle 120, the shorting cap 130, and the control module 140, may conform to ANSI (American National Standards Institute) or NEMA (National Electrical Manufacturers Association) standards. Any or all of these components could be compliant with standard UL498—Standard for Attachment Plugs and Receptacles, and C22.2 No. 42—General use receptacles, attachment plugs, and similar wiring devices. Any or all of these components could also be designed such that they are not interchangeable with any ANSI/NEMA WD6—Wiring Devices—Dimensional Specifications configurations to guard against accidental insertion of an incorrect plug. The various components of the equipment may also have the ability to use various amperage ratings.

FIG. 2 shows different views of a receptacle 120 as described in FIG. 1. In particular, FIG. 2A shows a plan view of the receptacle, FIG. 2B shows an isometric view of the receptacle, and FIG. 2C shows a view of the receptacle wiring leads. As shown in FIGS. 2A and 2B, the receptacle 120 comprises a top surface having a plurality of openings 202a-d for receiving corresponding pins from the shorting cap 130 or control module 140. The upper surface of the receptacle 120 having an oblong circular shape for receiving a control module 140 or shorting cap 130. The oblong shape enables a circular control module 140 or shorting cap 130 to be affixed securely to the receptacle. In a non-limiting example the receptacle 120 may be arranged so that between opposite points of polarity is sufficient spacing as outlined in the UL498. The pins on the shorting cap 130 and control module 140, when inserted into the openings 202a-d of the receptacle, may be configured to be twist-lock interfacing and comply with relevant standards (for example, ANSI).

The upper surface may also comprise sensor contacts 204a-d or openings corresponding to sensor contacts or pins on the control module 140 for receiving sensor data or information. The upper surface of the receptacle 120 may also comprise a ground opening 206 for receiving a grounding pin from the shorting cap 130 or control module 140. The receptacle 120 may be secured to the electric hot water heater tank using bolts. Slots 208 may be used for receiving such bolts.

As will be described in more detail herein, the shorting cap 130 and control module 140 may provide a locking mechanism requiring downward force to be provided for removal or insertions from the receptacle 120. This further ensures that the shorting cap 130 and control module 140 cannot be inadvertently removed from the receptacle 120. In an example the oblong shape of the upper surface of the receptacle 120 is for fastening the shorting cap 130 or control module 140 to the receptacle 120 having a generally circular profile. The diameter of the cap 130 or control module 140 may be equal to the largest dimension of the receptacle 120 upper surface. Dimples 210 at the ends of the upper surface of the receptacle hold the shorting cap 130 or control module 140 in place, which cannot be released unless opposing sides of the cap are squeezed, as will be further described.

Referring to FIG. 2C, a plurality of wire leads 220a, 220b, 220c, 220d, 220e (collectively, 220) may extend from a lower surface of the receptacle 120 and may be coupled with incoming power lines, outgoing power lines, sensors 116, 118, ground, etc. The wire leads 220 couple with openings on the upper surface of the receptacle 120 for receiving pins from the shorting cap 130 and control module 140. For example, wire leads 220a and 220b may couple with the incoming power lines. These would couple with two of the openings 202 on the upper surface of the receptacle 120 for coupling with pins extending from the lower surface of the shorting cap 130 or control module 140. Similarly, wire leads 220c and 220d may couple with the outgoing power lines. These wire leads couple with two of the openings 202 on the upper surface of the receptacle 120 for coupling with pins extending from the lower surface of the shorting cap 130 or control module 140. Sensor wire 202e may provide multiple wires (or additional wires provided) to couple to sensors such as a leak or freeze detection sensors 118 for coupling with sensor pins or contacts extending from the lower surface of the control module 140. There may be any number of wire leads extending from the bottom surface of the receptacle, depending on the functionality required and the number of elements or control functions required by the control module 140. Although wires are shown extending from the receptacle the leads may not be required and an interface may be provided for receiving connecting wires.

The receptacle 120 may be compliant with ANSI C136.4. The receptacle 120 material could be for example a thermoset resin or thermoplastic. The openings 202 and interior contacts may be made of a suitably conductive material such as for example a beryllium bronze, naval brass material, etc. The contact interfaces 204a-d may be made of a conductive material suitably signal conduction such as for example gold plated contacts.

Figure 2E:
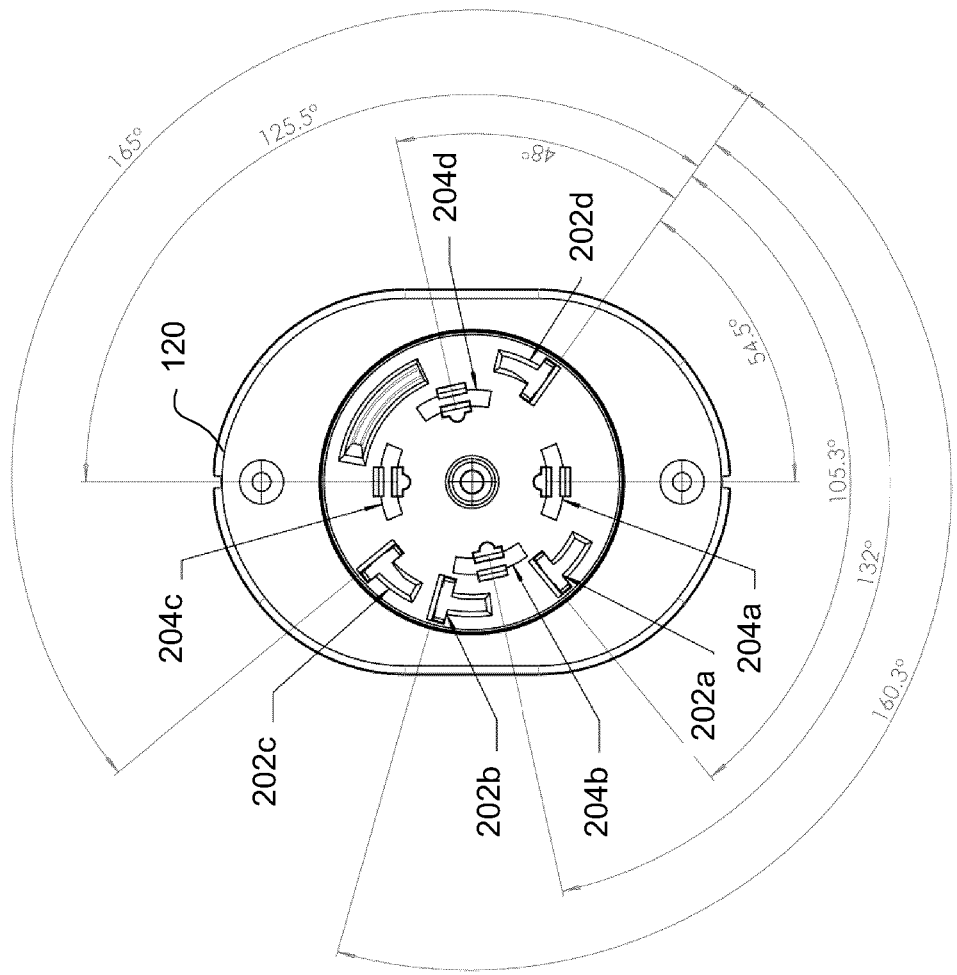
Figure 2D:
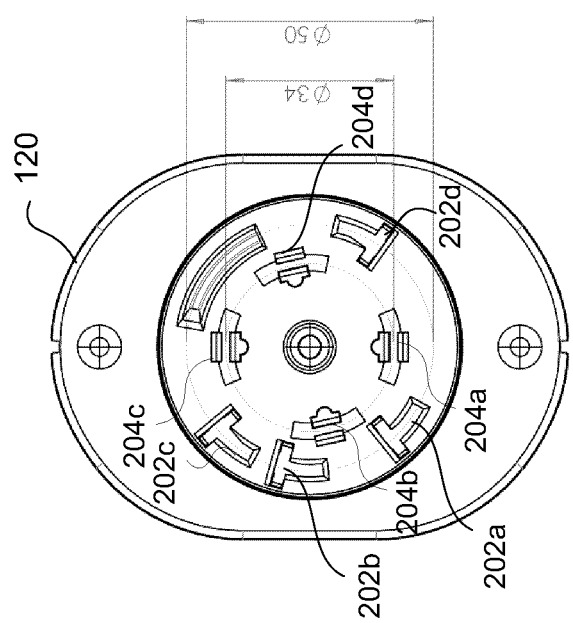

FIG. 2D shows a top view of the receptacle 120 with the diameters between the contacts. In the embodiment shown the inner contact interfaces are positioned along a circumference having a diameter of approximately 34 mm about the center of the receptacle 120 whereas the openings 202 are approximate spaced along a circumference having a diameter of approximately 50 mm. FIG. 2E shows the relative positioning of the openings 202a-202d and contacts 204a-204d in accordance with an embodiment of the receptacle. A first opening 202a is approximately 105° in a clockwise direction radially from a fourth opening 202d. A second opening 202b is approximately 160° clockwise from the fourth opening 202d. A third opening 202c is positioned approximately 165° in a counter-clockwise direction from the fourth opening 202d.

In the embodiment shown, the first contact 204a and third contact 204c are positioned along a center line of the receptacle 180° apart. Second contact 204b and third contact 204c are approximately positioned approximately 132° clockwise and approximately 125.5° counter-clockwise respectively from the first opening 202a. It should be understood that the dimensions may be within ±20% and angles may be within ±3° and may be modified within a tolerance enabling pin alignment with openings. The positions may also be modified based upon the number of openings and contacts without departing from the scope of the invention. A groove 207 may be provided on the surface of the receptacle 120 to receive an alignment pin from the cap 130 or control module 140.

FIG. 3 shows different views of a control module. In particular, FIG. 3A shows an isometric view as seen from below, FIG. 3B shows an isometric view as seen from above, and FIG. 3C shows a section view of the control module 140.

Figure 3A:
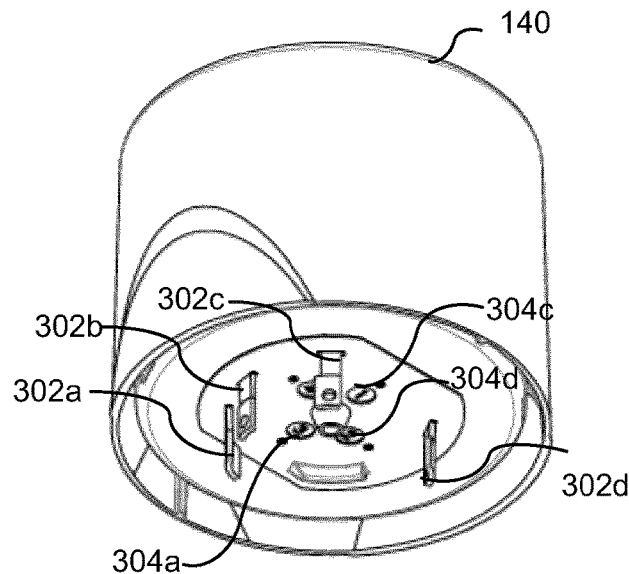
FIG. 3A-D shows different views of a control module as described herein.

FIG. 3A shows the aforementioned pins 302 for being inserted into the corresponding openings 202 on receptacle 120. Note that these pins may be L-shaped to assist with twist-locking into the receptacle 120. The pins 302 may also be straight however. The locking arrangement with the pin interface could provide a twist-lock interface between the control module 140 and the receptacle 120. As previously described these pins 202 may couple with incoming and outgoing power lines to control the electricity being delivered to the lower heating element 106. The positioning of the pins 302a-d and contacts 304a-d are positioned about the center of the module 140 in a matching orientation and position as respective openings 302a-d and contacts 204a-d in a similar orientation and position at aligned with the openings and contacts of the receptacle 120

Also extending from the control module 140 may be sensor pins or contacts 304 for insertion or interfacing with the sensor contacts or openings 204 of receptacle 120. The sensor pins or contacts 304 may also extend from the lower surface of the control module 140 for being inserted into the receptacle 120. The pins 304 may simply be contacts for interfacing with contact surfaces of the receptacle. The contacts/pins 304 could be used for receiving sensor data from receptacle wire leads coupled with various sensors 116, 118. The sensor pins 304 may carry the sensor data to the processor of the control module 140. If the sensor pins 304 are coupled to a leak/freeze detection sensor, the processor may interpret the data and if a leak is determined send notification to the user. If the sensor pins 304 are connected to a flow rate sensor, the processor may send the data to a utility provider or monitoring company, which may be useful to help with their billing estimates. The sensor pins 304 may also provide operational data associated with the water tank such as temperatures, power consumption, or efficiency data. The control module 140 may also communicate with a utility, or a local water control valve, to turn off the water when a leak or freeze is detected. The control module 140 may disconnect power from the heating elements or shut off a water valve when a sensor detects a leak/freeze or receives communication from remote wireless sensor.

Figure 3B:
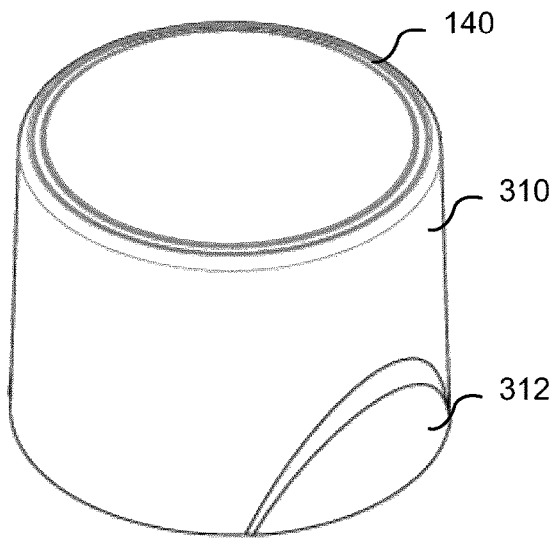

FIG. 3B shows the control module cover 310 and ribbing 312. As previously described with reference to FIG. 2, the control module 140 may be configured so that the cover 310 may be pushed downwardly to secure against dimples 210 located on the receptacle 120. The ribbing 312 enables an installer or user to squeeze inward the sides of the cover 310 along the parallel oblong side of receptacle 120 causing a deflection at the perpendicular sides of the control module cover 310 to release the cover 310 from the dimples 210 of the receptacle 120, thus allowing for the control module 140 to be removed from the receptacle 120 by a twisting motion. A similar ribbing configuration can be provided on the shorting cap 130 to enable locking of the shorting cap 130 to the receptacle 120.

Figure 3C:
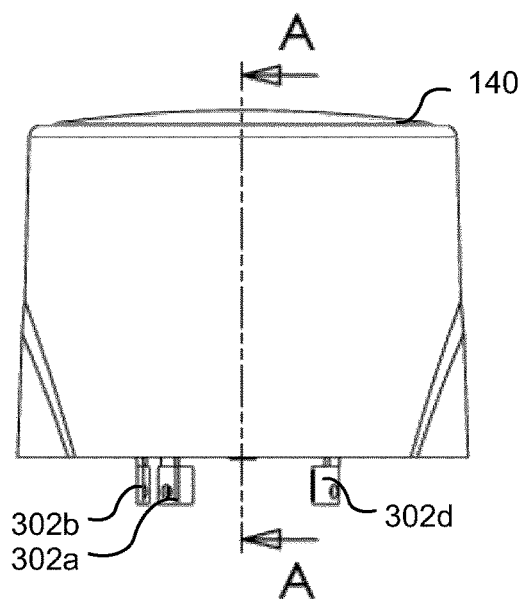
Figure 3D:
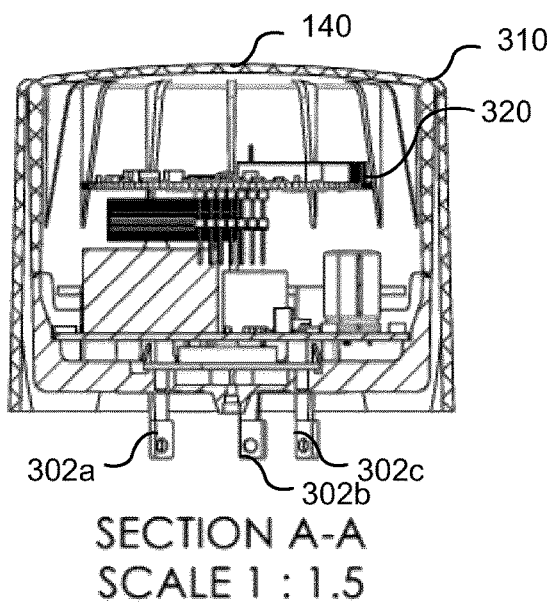

FIG. 3D shows a cross-sectional profile along line A-A shown in FIG. 3C. One or more radio boards 320 may be located in the upper portion of the control module 140 which could serve as a communication interface. The control module 140 may also comprise a processor and relay, along with other components as will be described with reference to FIG. 4.

The control module 140 may be compliant with ANSI C136.4. The receptacle 120 material could be for example a thermoset resin or thermoplastic. The pins 302 and interior contacts may be made of a suitably conductive material such as for example a beryllium bronze, naval brass material, etc. The contact or pins 304 may be made of a conductive material suitable for signal conduction such as provided by for example gold plated contacts. The positioning of the contacts 302 and pins 304 are arranged in positions corresponding to the openings 202 and contacts 204 or the receptacle and may be positioned to corresponding diameters and radial angles as described in FIGS. 2D and 2E.

Figure 4:
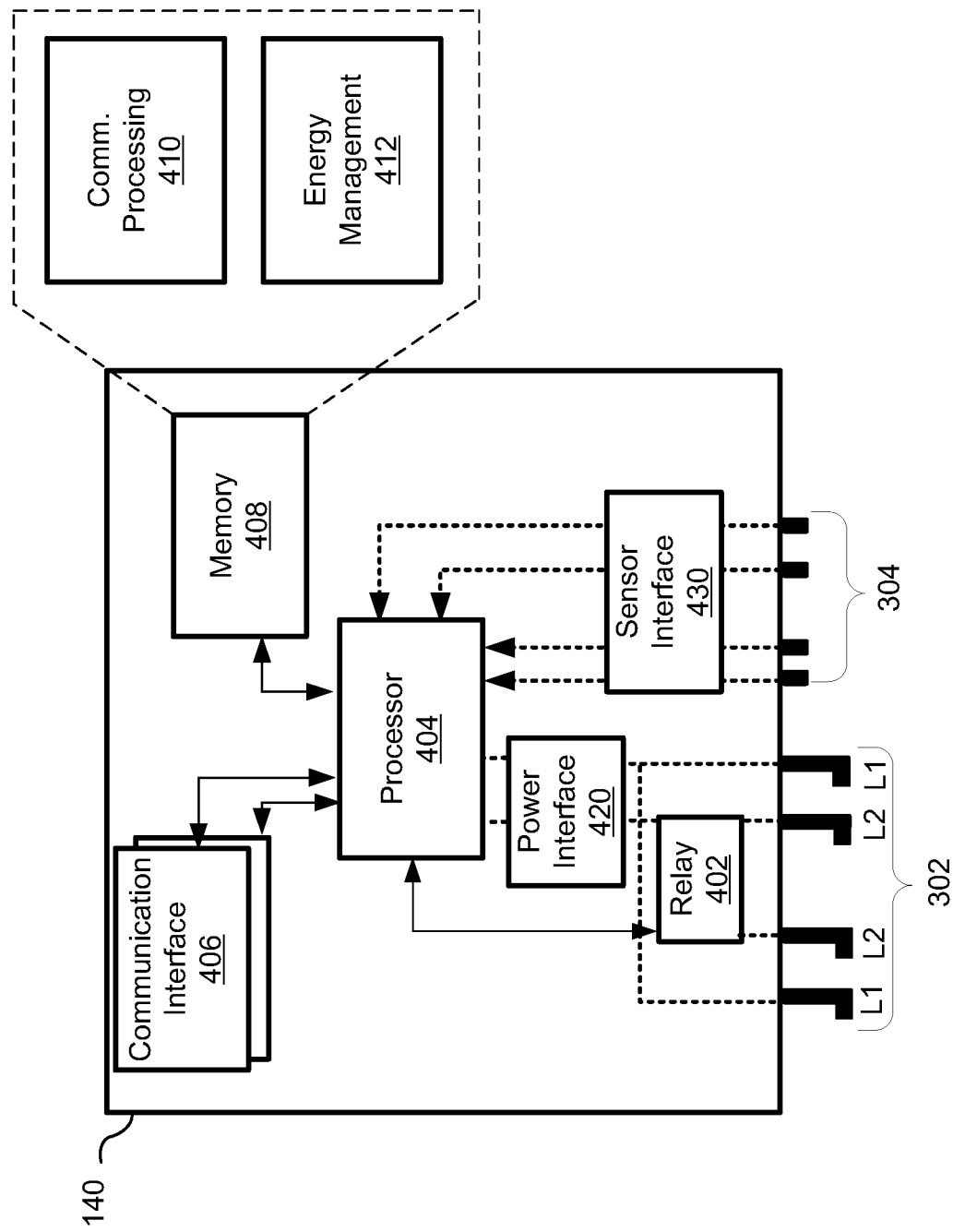
FIG. 4 shows a schematic representation of the control module elements.

FIG. 4 shows a schematic representation of the control module elements. The control module 140 comprises a relay 402, a processor 404 that can actuate the relay 402, and a communication interface 406 for receiving energy management instructions for interpretation by the processor 404 from memory 408. The processor 404 is powered from input power L1 L2 through a power interface 420 to produce voltages required by the processor. In addition to receiving energy management instructions, the communication interface 406 may also receive user instructions (such as instructions to override a demand response event or pre-heat water), and may also send communication to utility providers, users, etc., indicating compliance or non-compliance with the instructions received. The communication interface 406 allows for the processor 404 to send and receive communication with utility providers, central hubs, users/homeowners, etc. The communication interface 406 may have a radio board providing an antenna and wireless transceiver for wide-area network (WAN), local area network (LAN) or personal area network (PAN) communications. The radio board utilized may be different for each utility network depending on the required network interfaces. One or more communication interfaces 406 provide wired and/or wireless communications ability with one or more communications interfaces such as a wireless communication (wireless NIC), power line communication (power line controller NIC), wireless advanced metering infrastructure (AMI) communication (wireless AMI NIC), etc.

The memory 408 coupled to the processor 404 provide instructions for interpreting the energy management instructions received (through the communication functionality 410) and also for determining how to comply with the energy management instructions (using the energy management functionality 412). The energy management functionality 412 processes the energy instructions for controlling the hot water heater but may also communicate with devices coupled to the hot water heater, sensors within the building or home, and interface devices such as smart meters, smart grid nodes, thermostats or remote computing devices. The contacts or pins 304 are also directly or indirectly coupled, for example through a sensor interface 430, to the processor for providing sensor data or for controlling functions of the water tank such as increasing a thermostat temperature. The communication interface 406 in addition to allowing communication with a utility network may also communicate with devices within the building or home such as a thermostat, sensors, or computing devices such as a tablet or smartphone to provide operational information or allow functions to be changed or overridden.

Figure 5:
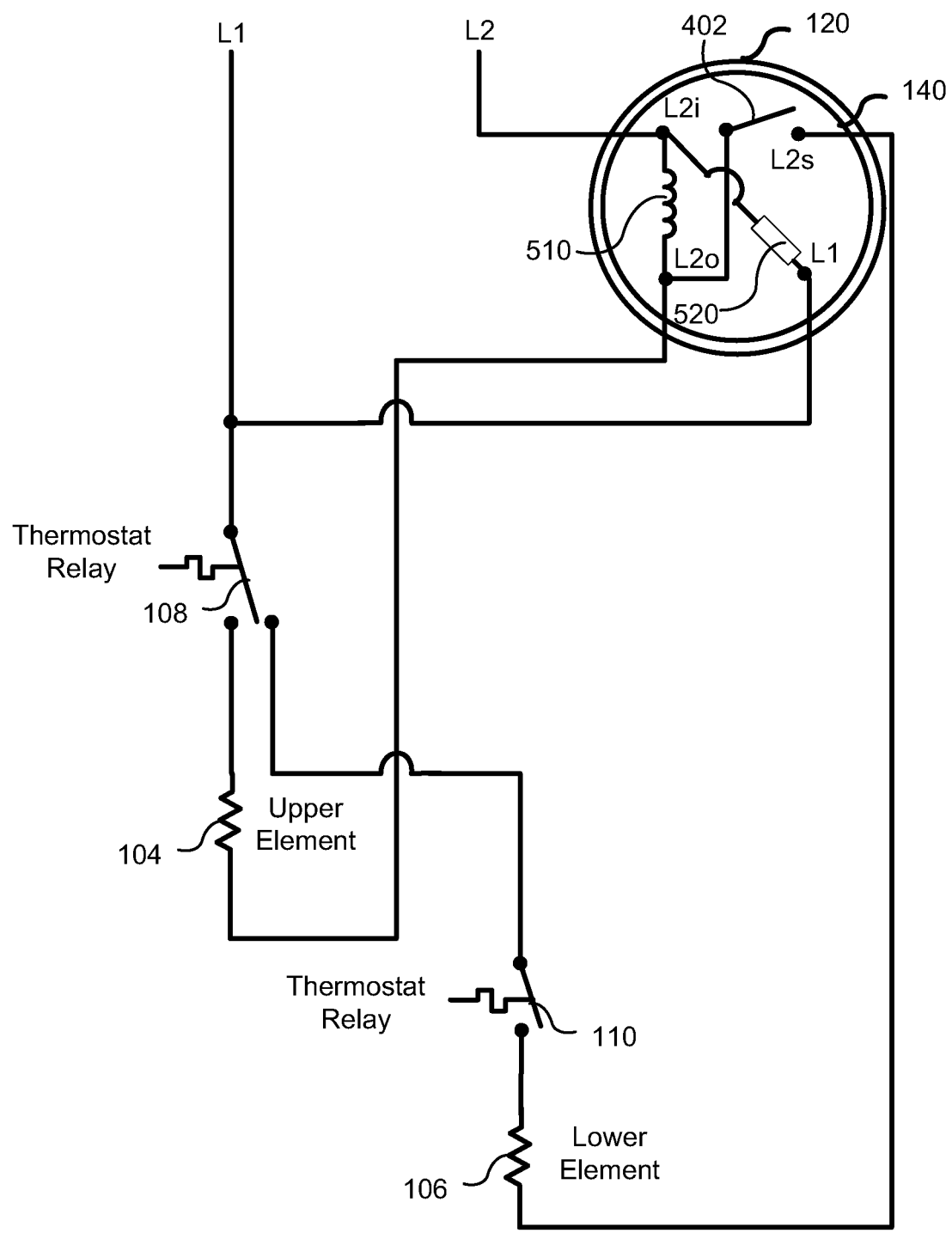
FIG. 5 shows an exemplary wiring diagram that could be configured within the electric hot water heater.

FIG. 5 shows an exemplary wiring diagram that could be configured within the electric hot water heater. The electric hot water heater may receive power from terminals L1 and L2. Coupled in series with the upper heating element 104 and lower heating element 106 are thermostat relays 108 and 110, respectively. The thermostat relay 108 for the upper heating element 104 can switch between providing electricity to the upper heating element 104 and the lower heating element 106. When the tank is filled with cold water, that is, water below the set temperature, the thermostat relay 108 switches to connect with the upper heating element 104, which heats up water in the upper portion of the electric hot water heater tank. When the water in the upper portion of the electric hot water heater tank reaches the set temperature, the thermostat relay 108 switches to connect with the lower heating element 106. If the water in the lower portion of the electric hot water heater tank is below the set temperature, the thermostat relay 110 coupled with the lower heating element 106 switches to a closed position, thereby providing electricity to the lower heating element 106 when relay 402 is closed. This causes the water temperature in the lower portion of the electric hot water heater tank to rise, and when the water reaches the set temperature the thermostat relay 110 switches to an open position to prevent further electricity flow to the lower heating element 106.

Connected in series with both the upper heating element 104 and lower heating element 106 is the receptacle 120. As can be seen from FIG. 5, the wiring coupled to the receptacle 120 allows for electricity to flow to the upper heating element 104, but has a break in connection between L2$o$ and L2$s$ for controlling electricity to the lower heating element 106. A current sensing element 510 between L2$i$ and L2$o$ may be used for measuring current flow through the heating elements. A voltage sensing element 520 may also be provided between L1 and L2$i$ to enable power measurement to be performed by the processor and communicated to a utility or third party management system. When the control module 140 is inserted into the receptacle 120, the relay 402 is used to control the flow of electricity to the lower heating element 106. The processor 404 of the control module 140 may receive power via appropriate power supply circuitry from terminals L1 and L2i or L2o shown within the receptacle 120, and output power to terminals L1, L2s and L2o. This is consistent with the labelling of pins 302 shown in FIG. 4. When the relay 402 is moved to an open position, this prevents the flow of electricity in the lower heating element, even if the thermostat relay 108 is coupled to the lower heating element 106 and the thermostat relay 110 is closed. This may correspond to a demand response event. When the relay 402 is moved to a closed position, electricity to the lower heating element 106 is controlled by the thermostat relays 108 and 110. In an alternative embodiment a second relay may be provided in the controller between the L2o node (which would no longer be a terminal) and 104 to allow control of the upper element 104.

When the shorting cap 130 is inserted into the receptacle 140, L2i, L2o and L2s are tied together by the shoring cap. Accordingly, there would be no control of the electricity to the lower heating element 106 by the receptacle 120 and shorting cap 130 configuration. Electricity flowing to the lower heating element 106 would be controlled solely by the upper and lower thermostat relays 108 and 110.

In an embodiment the wiring configuration could be further configured to allow for pre-loading of the electric hot water heater. This could be achieved by controlling the thermostat relay 110 to move to a closed position so that the lower heating element 106 can be activated. The temperature set-point may need to be adjusted to a higher temperature to allow additional electricity to be utilized by the hot water tank. The wiring configuration may have another lead (not shown) from the receptacle 120 coupled to either the thermostat relay 110 or directly to the lower heating element 106. The control module 140 may activate a second relay (not shown) to achieve the pre-loading to engage an additional thermostat with a higher temperature set-point to bypass the primary thermostat relay 110 during a pre-loading event.

Figure 6:
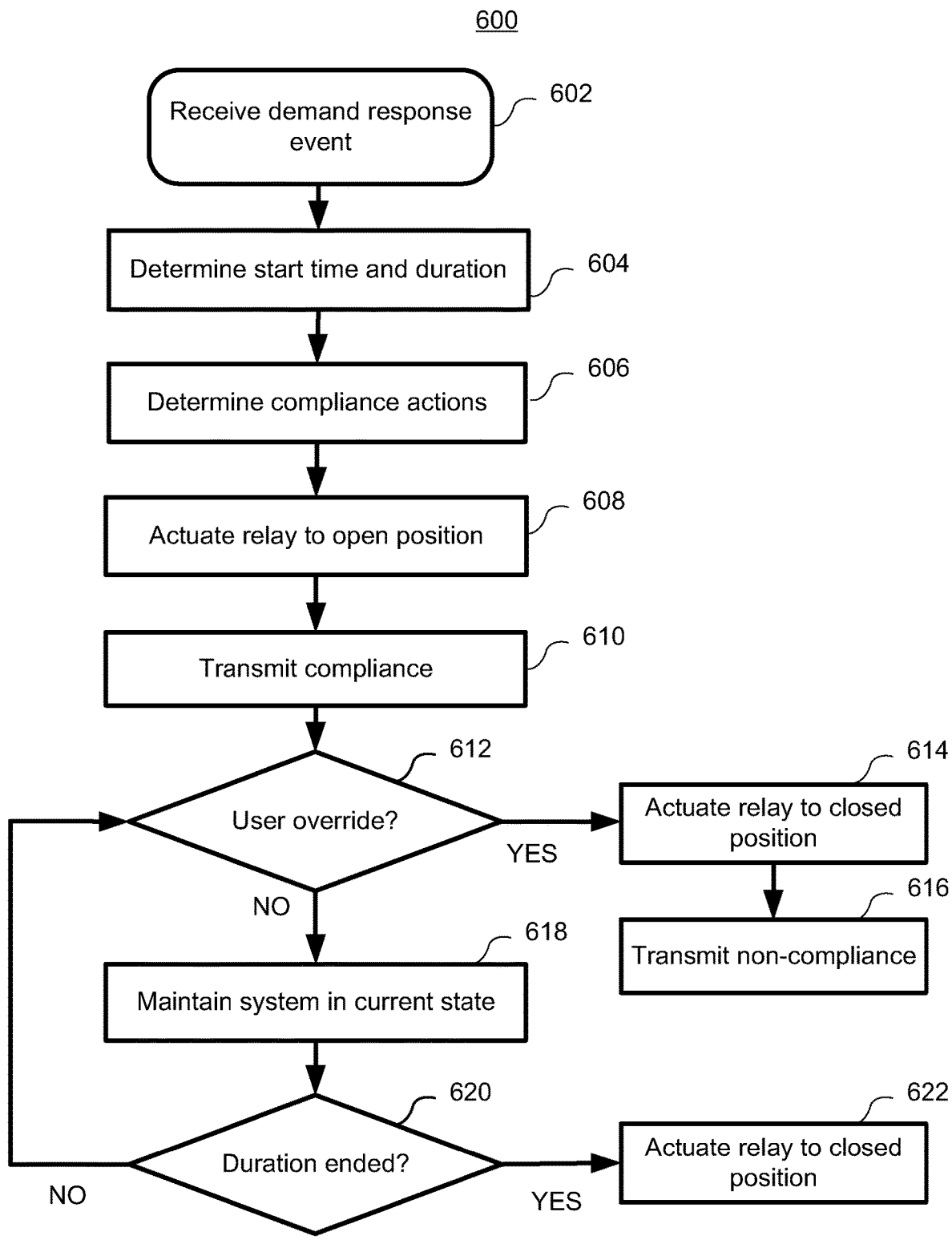
FIG. 6 shows a method for responding to a demand response event.

FIG. 6 provides a method for responding to a demand response event. The control module 140 receives notification of a demand response event (602) and the processor 404 determines a start time and duration of the event (604). The processor 404 may accomplish this by accessing its memory 408 and interpreting the instructions using the communication processing module 410. The processor 404 determines how to comply with the demand response event (606) which could again be determined by accessing its memory 408 and using the energy management module 412. As described with reference to FIG. 5, the processor 404 may actuate the relay 402, moving it to the open position (608) to prevent electricity from flowing to the lower heating element 106. The control module 140 may transmit compliance to the utility provider through its communication interface 406 (610).

The processor 404 determines if there has been a user override (612). If the processor 404 has not received indication of a user override (NO at 612) the system is maintained in the current state (618) until the duration of the demand response event has ended (YES at 620), at which point the processor 404 actuates the relay 402 to the closed position (622). If the duration has not ended the processor 404 determines if there has been a user override (612) and repeats the above loop if there is not user override (NO at 612). If, however, the processor 404 receives indication that the user has overridden the demand response event (YES at 612), the processor 404 actuates the relay 402 to the closed position (614). The control module 140 may transmit non-compliance to the utility provider through its communication interface 406 (616).

Figure 7:
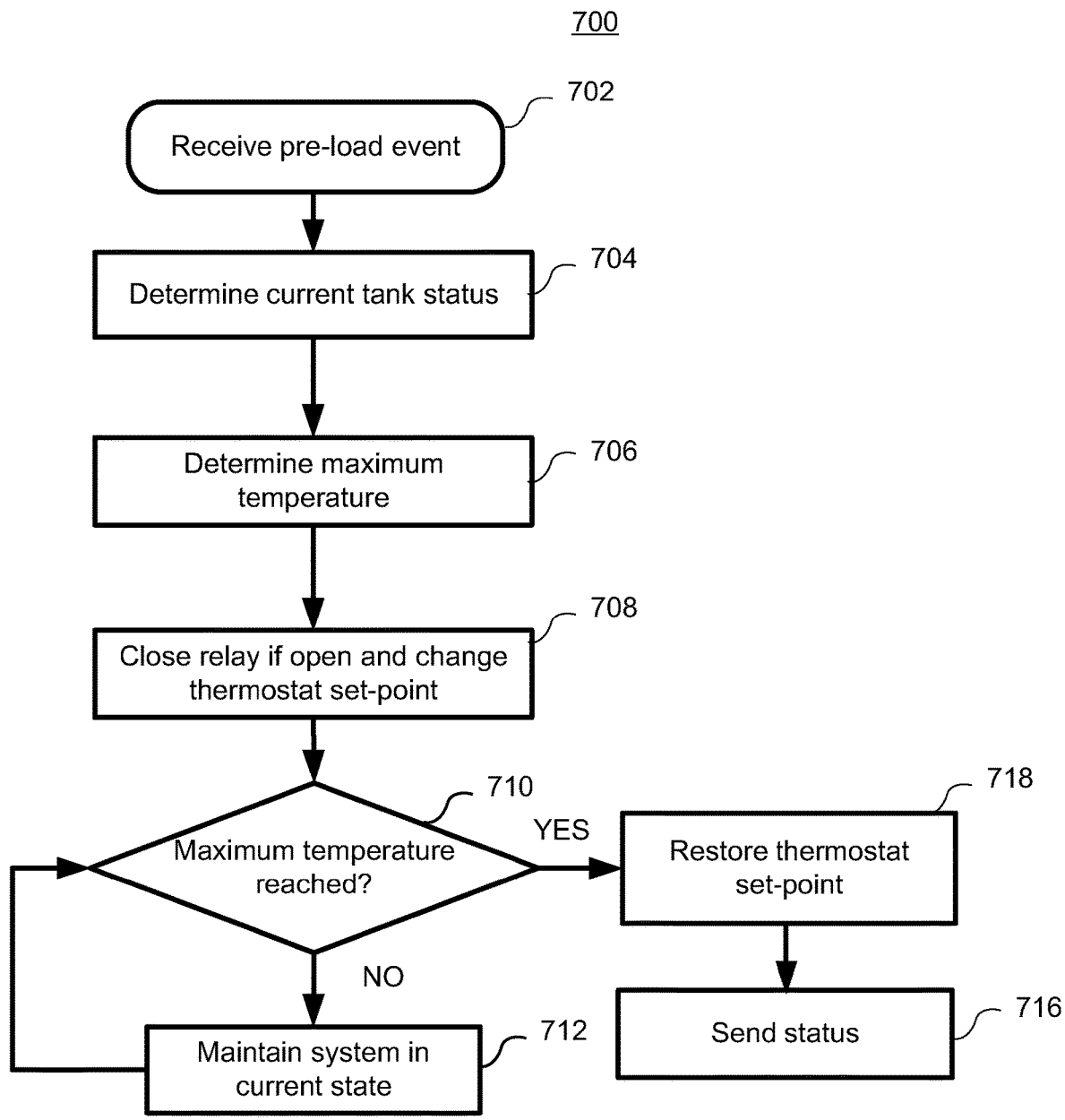
FIG. 7 shows a method for pre-loading an electric hot water heater.

FIG. 7 provides a method for pre-loading an electric hot water heater by increasing the temperature of the water contained therein. A utility may utilize the hot water tank as a sink for excess electricity or pre-load the tank in anticipation of a load control event. The control module 140 receives notification of a pre-load event (702), and the processor 404 determines the current tank status (704), for example by receiving a water temperature measurement from a sensor or thermostat. The relay 402 may be closed (if it was open) and the control module 140 can cause electricity to flow to the lower heating element 106 by changing temperature set-point of the thermostat relay 110 or switching in an alternate thermostat relay having a higher set-point (706). The processor 404 determines if the maximum water temperature has been reached (710). The maximum water temperature may be selected by a homeowner, utility or design tolerances of the tank and be higher than the normal set temperature. If the maximum water temperature has not been reached (NO at 710) the system is maintained in the current state (712), i.e. with electricity being provided to the lower heating element 106, and the processor 404 continues in a loop to determine if the maximum temperature has been reached (710). If it is determined that the maximum temperature has been reached (YES at 710), the processor 404 restores the thermostat relay 110 set-point (718) and no longer forces electricity to the lower heating element 106. The control module may send a status (716) through its communication interface 406, for example to the utility provider that had issued a pre-load event and/or to the homeowner indicating that a pre-load event has occurred, the new water temperature, etc. In a preloading event the upper element 140 (or other elements) may also be actuated if the receptacle 120 is configured to also be controlled by the control module 140.

The pre-load event shown by method 700 may precede a demand response event shown by method 600 of FIG. 6. During a demand event the water temperature may drop because the lower heating element may not operate, and therefore by pre-heating the water to a higher temperature during a pre-load would help to reduce the likelihood that the water temperature becomes too cold. However, as previously described there may be some instances where a utility provider has an oversupply of electricity and may be looking to distribute it. The same method 700 shown in FIG. 7 could apply, and a demand response event may not immediately follow.

Figure 8:
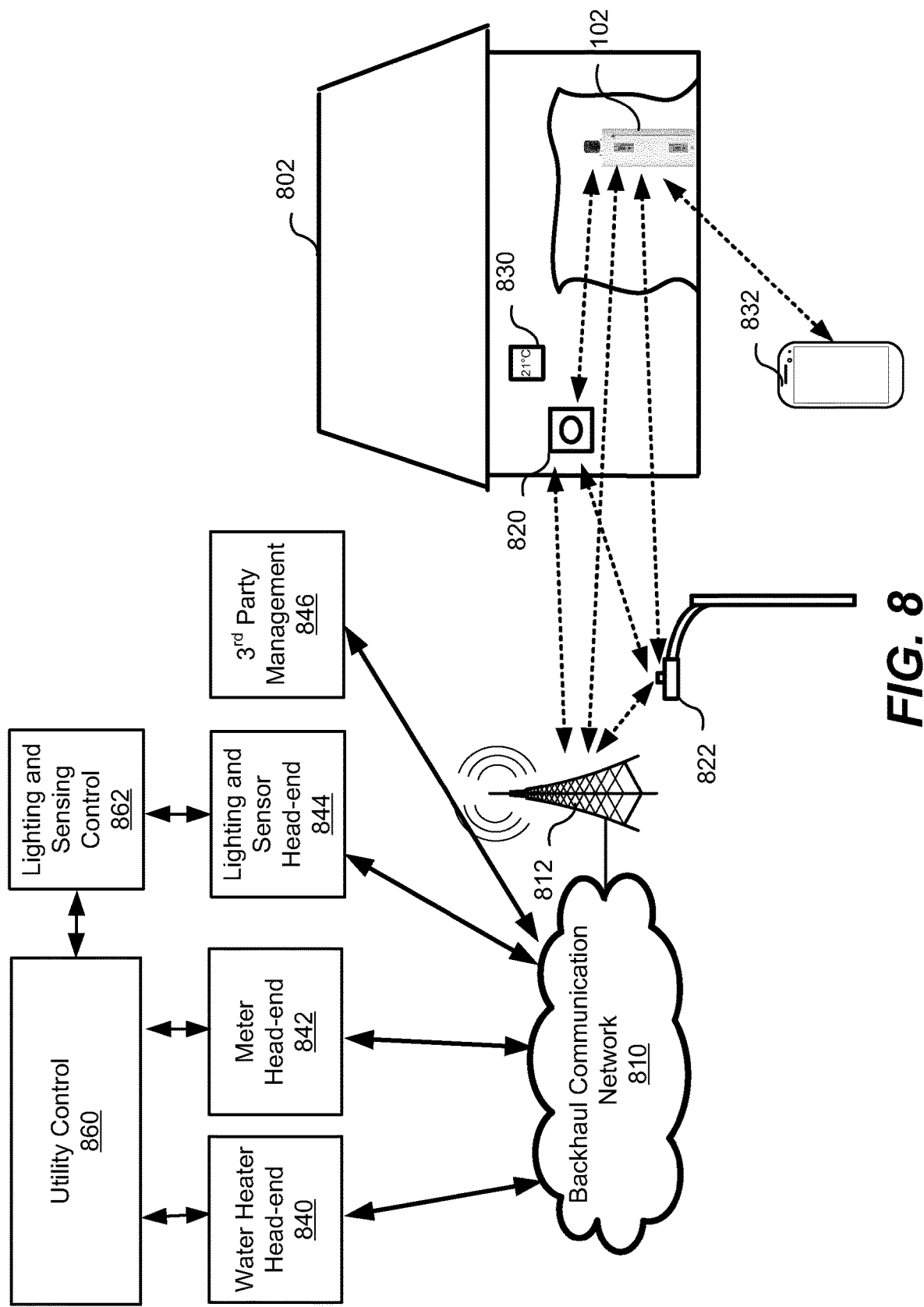
FIG. 8 shows an utility network system for energy management of electric hot water heaters.

FIG. 8 shows a utility network system for energy management of electric hot water heaters. The system comprises a plurality of electric hot water heaters 102 having receptacles 120 and control modules 140 located inside of a house or building 802 for example. Energy management instructions may be sent from, and energy usage data may be received by, a backhaul communication network 810. The energy management instructions and energy usage data may be sent and received from one or more antennas 812 that have transmitter and receiver functionalities. The control module 140 on electric hot water heater 102 may communicate directly with antenna 812, or it may communicate via several different paths depending on the architecture of the system being implemented and the system components based on that architecture. As shown in FIG. 8, some possibilities for system architecture could include smart meters 820 and streetlight wireless nodes 822, though these are not meant to be limiting. The equipment could be from different vendors and communicate securely with their unique head-end systems.

In the case of a mesh network, the network interface cards may discover each other, determine the optimal pathway, and use that exclusively as long as it is functional. Such additional system architecture is not necessary for operation, but may enhance the communication quality. Local master nodes, smart meters 820, and street light wireless nodes 822 may help to act as a bridge on the pathway. Street light communication nodes 822 are often an effective approach to augment the quality of communication in wireless mesh networks because of their locations.

All communication pathways may be in compliance with IPV6 mesh facilitating wireless communication between nodes with in the network. The nodes may also communicate between networks for example between a smartgrid network, cellular network and a local area network. Any communication between a smart meter and electric hot water tank may be for example but not limited to ISM, ZigBee™, Wi-Fi™, Power Line Carrier (PLC), cellular, or broadband access technologies and frequency spectrum.

The backhaul communications network 810 may send/receive communication to various head-ends and controls. For example, water heater controller data may be sent between a water heater head-end 840 and the backhaul communications network 810. Meter control and data may be sent between a meter head-end 842 and the backhaul communications network 810. Lighting and sensing control and data may be sent between a lighting and sensor head-end 844 and the backhaul communications network 810. A third party management system 846 may communicate with the control module 140 or with control devices such as home or building thermostat 830 or user devices such as tablets or smartphones 832. The home or building thermostat 830 and user devices 832 may also communicate directly with the controller or through an intermediary gateway or via the utility 860.

A utility control 860 may be used for load management, metering, and billing. Load management control data may be communicated through an open automated demand response (ADR) interface between the utility control 860 and the water heater head-end 840. Meter data and status collection may also be communicated through the utility control 860 and the meter head-end 842. Similarly, lighting and sensing status and management may be communicated between a lighting and sensing control 862 and the lighting and sensor head-end 844.

For example, a demand response event may be issued by the utility control 860 and sent through the open ADR to the water heater head-end 840. This is then communicated to the backhaul communications network which broadcasts the instructions using the antenna(s) 812 to control modules 140, smart meters 820, and/or streetlight wireless nodes 822. Upon receiving the instructions the control module 140 may cause the electric hot water heater 102 to comply with the demand response event and transmit communication back to the utility-side systems. The smart meter 820 may similarly extract energy usage data and communicate this to the backhaul communications network 810, which may send the data to the meter head-end 842 and the utility control 860.

Each element in the embodiments of the present disclosure may be implemented as hardware, software/program, or any combination thereof. Software codes, either in its entirety or a part thereof, may be stored in a computer readable medium or memory (e.g., as a ROM, for example a non-volatile memory such as flash memory, CD ROM, DVD ROM, Blu-ray™, a semiconductor ROM, USB, or a magnetic recording medium, for example a hard disk). The program may be in the form of source code, object code, a code intermediate source and object code such as partially compiled form, or in any other form.

It would be appreciated by one of ordinary skill in the art that the system and components shown in FIGS. 1-8 may include components not shown in the drawings. For simplicity and clarity of the illustration, elements in the figures are not necessarily to scale, are only schematic and are non-limiting of the elements structures. It will be apparent to persons skilled in the art that a number of variations and modifications can be made without departing from the scope of the invention as defined in the claims.

The invention claimed is:

1. A control module for insertion into an electric hot water heater, comprising:
a control module cover enclosing:
a processor for controlling an operation of a heating element located in a lower portion of an electric hot water heater tank, the heating element being coupled in series with a first thermostat relay located within the electric hot water heater that controls electricity to the heating element;
a communication interface coupled to the processor to communicate with a utility network head-end;
a plurality of pins extending from a lower surface of the control module to outside of the control module cover, the pins for insertion into a receptacle provided on a surface of the electric hot water heater tank to interface with power lines to the heating element within the electric hot water heater, wherein the receptable is coupled in series with the power lines to the heating element and wherein there is a break in electrical connection between the power lines to the heating element defined within the receptacle; and
a control module relay coupled with the plurality of pins so as to be coupled in series between the power lines to the heating element when the pins are inserted into the receptacle, the control module relay configured to be controlled by the processor to open and close the break in the electrical connection between the power lines for coupling and decoupling the power lines to the heating element in the lower portion of the electric hot water heater tank, independent of the first thermostat relay being in either an open or closed position, in response to instructions received through the communication interface from the utility network.

2. The control module of claim 1, wherein the instructions comprise a demand response event defining a period to disconnect the lower heating element to conserve electricity.

3. The control module of claim 2, wherein the control module communicates compliance with the demand response through the utility network when the instructions have been complied with.

4. The control module of claim 3, wherein the control module communicates a power consumption value to the utility network through the communication interface.

5. The control module of claim 2, wherein a user overrides the demand response event and the processor instructs the relay to close the break in the electrical connection to couple the power lines to the heating element and wherein the control module communicates non-compliance with the demand response instructions.

6. The control module of claim 1, wherein the communication interface comprises a first wireless network interface card (NIC) for communicating with a first network and a second wireless network interface card (NIC) for communicating with a second network.

7. The control module of claim 1, wherein the plurality of pins are twist-lock interfacing with the receptacle.

8. The control module of claim 1, wherein the control module cover is configured for being pressed downward after the plurality of pins are inserted into the receptacle, the control module cover interfacing with corresponding dimples on the receptacle to secure the control module to the receptacle.

9. The control module of claim 8, wherein the control module control module cover has ribbing on opposing sides of the outer surface, the ribbing deflecting ends of the cover when squeezed to release the control module cover from the dimples of the receptacle.

10. The control module of claim 9, wherein the control module cover is circular in shape and the receptacle is oblong in shape, wherein the ribbing of the control module cover aligns along the length of the oblong shape of the receptacle.

11. The control module of claim 1, further comprising one or more contacts provided on the lower surface of the control module, the one or more contacts interfacing with the processor for receiving sensor information from one or more sensors coupled to the electric hot water heater and the receptacle.

12. The control module of claim 11, wherein the contacts interfacing with corresponding pads on the receptacle and the one or more contacts are positioned along a circumference from a center of the control module.

13. The control module of claim 1 wherein the plurality of pins are positioned along a circumference from a center of the control module.

14. A method of remotely controlling electrical demand of an electric hot water heater, the method comprising:
receiving at a control module, inserted in a receptacle of an electric hot water heater, a notification of a control event through a communication interface of the control module;
determining, by a processor of the control module an action from the received event;
actuating a control module relay enclosed within a control module cover of the control module, the control module relay operably coupled with the processor to control electricity to a heating element located in a lower portion of an electric hot water heater tank at a start time of the control event, wherein the heating element is coupled in series with a first thermostat relay located within the electric hot water heater that controls electricity to the heating element, wherein the receptacle is coupled in series with power lines to the heating element and wherein there is a break in electrical connection between the power lines to the heating element defined within the receptacle, and wherein the control module relay is coupled in series between the power lines to the heating element and is configured to be controlled by the processor to open and close the break in the electrical connection between the power lines for coupling and decoupling the power lines to the heating element in the lower portion of the electric hot water heater tank, independent of the first thermostat relay being in either an open or closed position; and
actuating the control module relay, by the processor, at the completion of the control event.

15. The method of claim 14 wherein the control event comprises a demand response event, wherein the electricity to the lower element is interrupted during the duration of the event.

16. The method of claim 14 wherein the control event comprises a pre-loading event, wherein the electricity to the lower element is applied during the duration of the event.

17. The method of claim 16 wherein a temperature set-point of a thermostat associated with the lower heating element is modified in response to the pre-loading event.

18. The method of claim 14 further comprising communicating compliance or non-compliance of the control event to a utility providing the control event.

19. The method of claim 18 wherein the communication comprises a power consumption value.

20. The method of claim 18 wherein the notification is provided by a thermostat remote to the electric hot water heater.

21. The method of claim 18 wherein the control module communicates through a wireless mesh network.

* * * * *